United States Patent
Kim et al.

(10) Patent No.: US 11,539,205 B2
(45) Date of Patent: Dec. 27, 2022

(54) INRUSH CURRENT LIMITER AND SYSTEM INCLUDING THE SAME

(71) Applicant: Samsung SDI Co., Ltd., Yongin-si (KR)

(72) Inventors: Keunyoung Kim, Yongin-si (KR); Hyun Kim, Yongin-si (KR); Jaesoon Park, Yongin-si (KR); Sunho Choi, Yongin-si (KR)

(73) Assignee: Samsung SDI Co., Ltd., Yongin-si (KR)

(*) Notice: Subject to any disclaimer, the term of this patent is extended or adjusted under 35 U.S.C. 154(b) by 0 days.

(21) Appl. No.: 17/229,436

(22) Filed: Apr. 13, 2021

(65) Prior Publication Data
US 2021/0376596 A1 Dec. 2, 2021

(30) Foreign Application Priority Data
May 28, 2020 (KR) .................. 10-2020-0064398

(51) Int. Cl.
*H02H 9/00* (2006.01)
*H03K 17/687* (2006.01)

(52) U.S. Cl.
CPC ........... *H02H 9/001* (2013.01); *H03K 17/687* (2013.01)

(58) Field of Classification Search
CPC ....... H02H 9/001; H02H 9/005; H03K 17/687
USPC ....................................................... 361/93.9
See application file for complete search history.

(56) References Cited

U.S. PATENT DOCUMENTS

| 2004/0085698 A1* | 5/2004 | Ball .................. H02H 9/001 361/100 |
| 2014/0118054 A1 | 5/2014 | Koo et al. |
| 2014/0146429 A1 | 5/2014 | Lee et al. |
| 2016/0172844 A1 | 6/2016 | van Dijk |

(Continued)

FOREIGN PATENT DOCUMENTS

| JP | 2015154688 A * | 8/2015 |
| JP | 6369890 B2 | 8/2018 |

(Continued)

OTHER PUBLICATIONS

European Office Action dated Oct. 15, 2021, EP Application No. 21169370.0, 6 pages.

(Continued)

*Primary Examiner* — Kevin J Comber
(74) *Attorney, Agent, or Firm* — Lewis Roca Rothgerber Christie LLP

(57) ABSTRACT

Provided is an inrush current limiter and a system including the same, the inrush current limiter including first and second input nodes for receiving an input voltage from a power source, a first output node and a second output node for being connected with a load, an inrush-current-limiting portion including a transistor connected between the first input node and the first output node, and for turning on the transistor when a voltage level of the input voltage is higher than a first level, and for limiting an inrush current by controlling time until the transistor is turned on after application of the input voltage, a switch connected between a control terminal of the transistor and the second input node, and a mode controller for turning on the switch when the voltage level of the input voltage is lower than a second level that is lower than the first level.

20 Claims, 5 Drawing Sheets

(56) References Cited

U.S. PATENT DOCUMENTS

2016/0181794 A1* 6/2016 Kimura ................ H02H 9/001
                                                            361/93.9
2016/0268892 A1* 9/2016 Gupta .................... H02M 3/07
2018/0175611 A1   6/2018 Okamoto

FOREIGN PATENT DOCUMENTS

| JP | 2020-065420 A | 4/2020 |
| KR | 10-0453849 B1 | 10/2004 |
| KR | 10-2011-0033485 A | 3/2011 |
| KR | 10-2014-0053768 A | 5/2014 |
| KR | 10-2014-0070752 A | 6/2014 |

OTHER PUBLICATIONS

Korean Office Action, Patent Application No. 10-2020-0064398, dated Oct. 31, 2022, 13 pages.

* cited by examiner

INRUSH CURRENT LIMITER AND SYSTEM INCLUDING THE SAME

CROSS-REFERENCE TO RELATED APPLICATION

This application claims priority to, and the benefit of, Korean Patent Application No. 10-2020-0064398 filed in the Korean Intellectual Property Office on May 28, 2020, the entire contents of which are incorporated herein by reference.

BACKGROUND

1. Field

Embodiments of the present disclosure relate to an inrush current limiter, and a system including the same.

2. Description of the Related Art

Inrush current is a transient phenomenon that occurs depending on the size of a load when an input voltage is applied in an electrical/electronic system. The inrush current may be suitable limited because the inrush current may otherwise cause permanent damage, faults, or abnormal operation of the system. In general, a battery management system (BMS) applied to a battery pack is also applied with a technology for limiting an inrush current.

Meanwhile, in the case of vehicles, vehicles being one of the representative systems in which a battery pack is mounted, most vehicles use a lead acid battery as a low voltage (LV) power source. Accordingly, due to the influence of inductive and capacitive loads connected to the lead acid battery, a system may suitably normally operate in a very wide supply voltage range (e.g., at a maximum of about 58.5 V) in an electromagnetic compatibility (ECM) test.

However, in the case of the conventional inrush current limiter designed for a high voltage (HV) system, when the supply voltage is lowered below a certain level, there may be a problem in which an erroneous operation is caused, and thus there may be room for improvement.

The above information disclosed in this Background section is only for enhancement of understanding of the background of the invention, and therefore may contain information that does not form the prior art.

SUMMARY

Issues to be solved through embodiments of the present disclosure may relate to an inrush current limiter, and to a system including the same, which may enable normal operation of the system even in an EMC test environment by improving an operation voltage range of an inrush current limiting circuit.

An inrush current limiter according to some embodiments may include a first input node and a second input node for receiving an input voltage from a power source, a first output node and a second output node for being connected with a load, an inrush-current-limiting portion including a transistor connected between the first input node and the first output node, and for turning on the transistor when a voltage level of the input voltage is higher than a first level, and for limiting an inrush current by controlling time until the transistor is turned on after application of the input voltage, a switch connected between a control terminal of the transistor and the second input node, and a mode controller for turning on the switch when the voltage level of the input voltage is lower than a second level that is lower than the first level.

The transistor may include a first terminal connected to the first input node, and a second terminal connected to the first output node, wherein turn-on of the transistor is controlled by a voltage between the first terminal and the control terminal.

The transistor may include a metal-oxide semiconductor field-effect transistor (MOSFET), wherein the first terminal and the second terminal respectively include a source and a drain of the transistor, and wherein the control terminal includes a gate of the transistor.

The second input node may be connected to a ground.

The inrush current limiter may include a gate driver for gradually increasing a voltage between the first terminal and the control terminal when the input voltage is input.

The gate driver may include a first resistor and a first capacitor connected in parallel between the first terminal and the control terminal, and a third resistor that is connected between the control terminal and the second input node.

The gate driver may further include a Zener diode that is connected between the first terminal and the control terminal for limiting a voltage between the first terminal and the control terminal.

The inrush current limiter may further include a feedback portion connected between the second terminal and the control terminal for stabilizing a voltage between the first terminal and the control terminal.

The feedback portion may include a second capacitor and a second resistor connected in series between the first terminal and the control terminal.

The mode controller may include a comparator including a first input terminal for receiving a comparison voltage corresponding to the input voltage, a second input terminal for receiving a reference voltage, and an output terminal for outputting an output signal corresponding to a comparison result of voltages input through the first and second input terminals to a control terminal of the switch.

The mode controller may include a fourth resistor and a fifth resistor that are connected in series as part of a voltage divider circuit for outputting the comparison voltage divided from the input voltage to the first input terminal.

The mode controller may further include a sixth resistor between the second input terminal and the output terminal of the comparator, wherein the comparator is configured to operate as a hysteresis comparator based on a hysteresis band having a lower limit that is lower than the reference voltage, and an upper limit that is higher than the reference voltage, is configured to output an output signal that turns on the switch to the output terminal when the comparison voltage is lower than the lower limit, and is configured to output an output signal that turns off the switch when the comparison voltage is higher than the upper limit.

The fourth resistor and the fifth resistor may be connected between the first output node and ground, wherein the comparator is configured to be activated after application of the input voltage.

The fourth resistor and the fifth resistor may be connected between the first input node and the ground.

A system according to some embodiments may include the inrush current limiter.

According to the disclosed embodiments, the operation voltage range of the inrush current limiting circuit is improved to enable normal operation of the system even in an EMC test environment.

DETAILED DESCRIPTION

Figure 1:
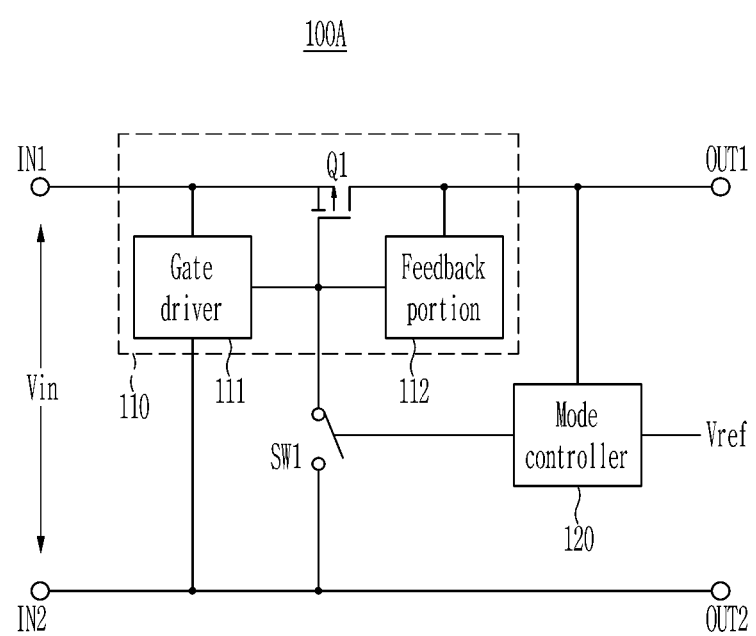
FIG. 1 schematically illustrates an inrush current limiter according to some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, an inrush current limiter according to some embodiments will be described in detail with reference to the drawings.

FIG. 1 schematically illustrates an inrush current limiter according to some embodiments.

Referring to FIG. 1, an inrush current limiter 100A according to some embodiments may include input nodes IN1 and IN2 that are connected with a power source, output nodes OUT1 and OUT2 that are connected with a load, an inrush current limiter 110, a mode control switch SW1, and a mode controller 120.

The inrush current limiter 110 is a circuit that is connected between the input nodes IN1 and IN2 and the output nodes OUT1 and OUT2 and performs an inrush current limitation function when power is connected. The inrush current limiter 110 may include a transistor Q1 connected between a first input node IN1 of the input nodes and a first output node OUT1 of the output nodes, a gate driver 111 connected between an input terminal of the transistor Q1 and a control terminal of the transistor Q1, and a feedback portion 112 connected between an output terminal of the transistor Q1 and the control terminal of the transistor Q1.

The gate driver 111 turns on the transistor Q1 when an input voltage Vin of a first voltage level or higher is input, and may gradually increase a voltage between the control terminal and the input terminal of the transistor Q1 such that the transistor Q1 is turned on after a time lapse (e.g., a predetermined time lapse) following the application of the input voltage Vin. On-resistance of the transistor Q1 is gradually decreased during a time period (e.g., a predetermined time period) by the gate driver 111 after application of the input voltage Vin, and accordingly, a sudden current fluctuation due to the turn-on of the transistor Q1 does not occur, thereby limiting the inrush current.

The feedback portion 112 is a negative feedback portion that is connected between the output terminal and the control terminal of the transistor Q1, and may perform a function of suppressing the inrush current by stabilizing (or planarizing) a voltage between the control terminal and the input terminal of the transistor Q1. That is, the inrush current can be suppressed by suppressing the sudden fluctuation of the voltage between the control terminal and the input terminal of the transistor Q1.

The mode control switch SW1 is connected between the control terminal of the transistor Q1 in the inrush current limiter 110 and a second input node IN2 of the input nodes, and may perform a function of switching electrical connection between the second input node IN2 and the control terminal of the transistor Q1. When the mode control switch SW1 is turned off, the transistor Q1 may operate in an inrush current limitation mode during which the turning-on of the transistor Q1 is controlled by the gate driver 111 in the inrush current limiter 110. On the contrary, when the mode control switch SW1 is turned on, the control terminal of the transistor Q1 is electrically connected with the second input node IN2, and the transistor Q1 may operate in a mode (e.g., an EMC test mode) during which the turning-on of the transistor Q1 is controlled according to the input voltage Vin regardless of operation of the gate driver 111.

When the mode control switch SW1 is turned on, the control terminal of the transistor Q1 is directly connected to the second input node IN2, and the input voltage Vin corresponds to a voltage between the input terminal and the control terminal of the transistor Q1. Accordingly, the transistor Q1 may be turned on when a voltage level of the input voltage Vin is equal to or higher than a threshold voltage level (hereinafter referred to as a second voltage level) of the transistor Q1.

When the mode control switch SW1 is turned off, that is, when the transistor Q1 operates in the inrush current limitation mode, the transistor Q1 may be turned on by the gate driver 111 when the voltage level of the input voltage Vin is equal to or higher than a first voltage level. The gate driver 111 transmits a voltage divided from the input voltage Vin through a voltage divider circuit to the control terminal of the transistor Q1, as will be described later. Thus, the first voltage level that determines turning-on of the transistor Q1 in the inrush current limitation mode may be higher than the above-stated second voltage level.

The mode controller 120 receives the input voltage Vin supplied from the power source, and controls operation of (e.g., turn-on/turn-off of) the mode control switch SW1 according to a level of the received input voltage Vin. That is, the mode controller 120 compares the input voltage Vin, or the voltage level of the voltage divided from the input voltage Vin, with a reference voltage (e.g., a predetermined reference voltage) Vref, or with a reference voltage range (e.g., a predetermined reference voltage range), and controls switching of the mode control switch SW1 according to a comparison result.

For example, the mode controller 120 may turn on the mode control switch SW1 when the voltage level of the input voltage Vin, or the voltage divided from the input voltage Vin, is lower than the reference voltage Vref, or lower than a lower limit of the reference voltage range, in the turn-off state of the mode control switch SW1.

In addition, for example, the mode controller 120 may turn off the mode control switch SW1 when the voltage level of the input voltage Vin, or the voltage divided from the input voltage Vin, is higher than the reference voltage Vref, or higher than an upper limit of the reference voltage range in the turn-on state of the mode control switch SW1. Here, the upper limit and the lower limit of the reference voltage range may be set based on a reference voltage Vref input to the mode controller 120.

Figure 2:
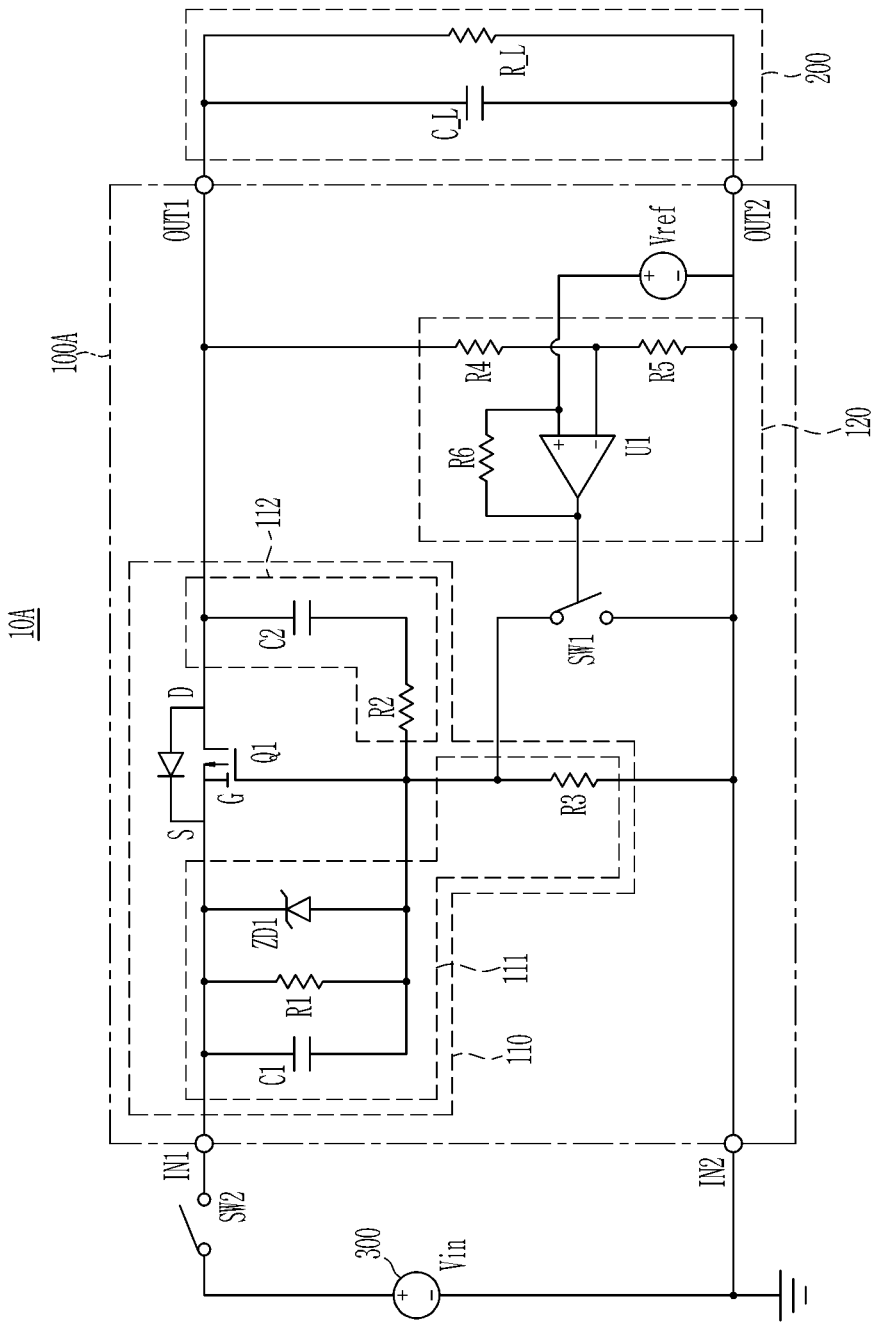
FIG. 2 shows a system where the inrush current limiter according to some embodiments of the present disclosure is applied.

FIG. 2 shows a system where the inrush current limiter according to some embodiments of the present disclosure is applied.

Referring to FIG. 2, a system 10A may include an inrush current limiter 100A that is connected between a power source 300 and a load 200. Such a system 10A may be, for example, a vehicle system.

The power source 300 may be electrically connected to the input nodes IN1 and IN2 of the inrush current limiter 100A, and may supply an input voltage Vin to the inrush current limiter 100A. For example, when the system 10A includes a high voltage battery pack, the power source 300 may be a high voltage battery back. In addition, for example, the power source 300 may be an external power source for an EMC test. When the power source 300 is an external power source, the power source 300 may supply an input voltage Vin from approximately 5 V to approximately 58.5 V to the inrush current limiter 100A.

The system 10A further includes a main switch SW2, and a connection with the inrush current limiter 100A may be controlled by the power source 300.

As described above, the inrush current limiter 100A may include an inrush current limiter 110, a mode control switch SW1, and a mode controller 120. In addition, the inrush current limiter 110 may include a transistor Q1, a gate driver 111, and a feedback portion 112.

The transistor Q1 may operate as a switch that is connected between an input node/first input node IN1 and an output node/first output node OUT1 to block or allow a current flow between the two nodes. As shown in FIG. 2, when the first input node IN1 is connected to a positive output of the power source 300 and the second input node N2 is connected to a negative output of the power source 300, the transistor Q1 may be, for example, a P-channel metal-oxide semiconductor field-effect transistor (P-channel MOSFET). However, some embodiments of the present disclosure are not limited thereto, and the transistor Q1 may be an N-channel MOSFET. In this case, the second input node IN2 of the inrush current limiter 100A may be connected to the positive output of the power source 300, and the first input node IN1 may be connected to the negative output of the power source 300.

Hereinafter, for better understanding and ease of description, the case where the transistor Q1 is a P-channel MOSFET will be described as an example.

The gate driver 111 may include a first capacitor C1 and a first resistor R1 that are connected in parallel between a source and a gate of the transistor Q1, and a third resistor R3 that is connected between the gate of the transistor Q1 and the second input node IN2.

When the main switch SW2 is turned on and an input voltage of higher than a first voltage level is input from the power source 300, a current supplied from the power source 300 flows via the first resistor R1 and the third resistor R3, and the first capacitor C1 is changed by the supply voltage of the power source 300. Accordingly, a gate voltage Vg of the transistor Q1 is gradually decreased by charging of the first capacitor C1, and a gate-source voltage Vgs of the transistor Q1 is gradually increased.

Thereafter, when the gradually increasing gate-source voltage Vgs of the transistor Q1 reaches a threshold voltage Vth of the transistor Q1, the transistor Q1 is turned on. In this case, a time constant that determines the time when the gate-source voltage Vgs of the transistor Q1 reaches the threshold voltage Vth of the transistor Q1 may be determined by capacitance of the first capacitor C1 and resistance values of the first resistor R1 and the third resistor R3. In addition, a voltage level of the input voltage Vin that turns on the transistor Q1 may be determined by the resistance values of the first resistor R1 and the third resistor R3.

Meanwhile, the gate driver 111 may further include a Zener diode ZD1 that includes a cathode connected to the source of the transistor Q1, and an anode connected to the gate of the transistor Q1. The Zener diode ZD1 may serve to limit the gate-source voltage Vgs of the transistor Q1 within its rated voltage. Thus, a voltage between lateral ends of the first capacitor C1 connected with the Zener diode ZD1 in parallel may be limited by the Zener diode ZD1.

The feedback portion 112 may include a second capacitor C2 connected in series between a drain and the gate of the transistor Q1, and may also include a second resistor R2. Such a feedback portion 112 provides a feedback path between the drain and the gate of the transistor Q1 to provide a function of suppressing an inrush current transmitted to a load-side capacitor C_L by stabilizing the gate-source voltage Vgs of the transistor Q1.

The mode controller 120 may include a comparator U1 and voltage divider circuits R4 and R5.

The voltage divider circuits R4 and R5 include a fourth resistor R4 and a fifth resistor R5 that are connected in series between the first output node OUT1 and the second input node IN2 (e.g., a ground), and divide a voltage, which is transmitted to the first output node OUT1 through the transistor Q1, and transmit the divided voltage as an input voltage of the comparator U1. For this, the fourth resistor R4 is connected between the first output node OUT1 and a first input terminal of the comparator U1, and the fifth resistor R5 may be connected between the first input terminal of the comparator U1 and the second input node IN2 (e.g., ground).

The comparator U1 may include a first input terminal (e.g., a negative input) that receives a voltage divided from the voltage divider circuits R4 and R5, a second input terminal (e.g., a positive input) to which the reference voltage Vref is input, and an output terminal outputting a control signal to the mode control switch SW1.

The comparator U1 may output a signal (e.g., a high level signal) to turn on the mode control switch SW1 to the output terminal when the voltage received through the first input terminal is lower than the reference voltage Vref. On the other hand, the comparator U1 may output a signal (e.g., a low level signal) to turn off the mode control switch SW1 to the output terminal when the voltage input through the first input terminal is higher than the reference voltage Vref.

The comparator U1 may be a hysteresis comparator. The hysteresis comparator U1 may operate by a hysteresis band (referred to as a reference voltage range herein), which may be defined by an upper limit and a lower limit. When the comparator U1 operates as a hysteresis comparator, the mode controller 120 may further include a sixth resistor R6 that is connected between the second input terminal and the output terminal of the comparator U1, and that determines the hysteresis band of the comparator U1. The hysteresis band of the hysteresis comparator U1, that is, the reference voltage range, may be determined by a lower limit determined at a lower level, and an upper limit determined at a higher level, based on the reference voltage Vref input to the second input terminal of comparator U1, and the upper and lower limits may be determined by the sixth resistor R6.

Such a hysteresis comparator U1 may output a signal (e.g., a high level signal) to turn on the mode control switch SW1 to the output terminal when a voltage input to the first input terminal is lower than the lower limit of the reference voltage range, and may output a signal (e.g., a low level signal) to turn off the mode control switch SW1 to the output terminal when the voltage input to the first input terminal is higher than the upper limit of the reference voltage range.

The above-described reference voltage Vref or the reference voltage range may be set so that the mode control switch SW1 can be turned on when the input voltage Vin has a lower voltage level than the first voltage level.

Meanwhile, the mode controller 120 (e.g., the comparator U1 of the mode controller 120) is prevented from malfunctioning due to transmission of a part of the input voltage Vin to the first output node OUT1 at the early connection stage of the power source 300 (e.g., while the inrush current limiter 110 performs an inrush current limitation operation). To prevent power wastage due to unnecessary operation of the comparator U1 while performing the inrush current limiting operation, the comparator U1 may be controlled to be activated after an amount of time (e.g., a predetermined time) after power from the power source 300 is applied. That is, an operation voltage for operating the comparator U1 is applied after a delay (e.g., a predetermined delay) after the power source 300 is connected such that the comparator U1 operates in a state in which the voltage transmitted to the load 200 through the first output node OUT1 is stabilized. In such a state, the transistor Q1 is completely turned on (fully turned on) to operate in saturation, and an input voltage Vin may be applied to the first output node OUT1.

Meanwhile, in the above-described example, a case in which the mode controller 120 is connected to the first output node OUT1 of the inrush current limiter 100A to monitor the input voltage Vin input from the power source 300 is described, but some embodiments of the present disclosure is not limited thereto.

Figure 3:
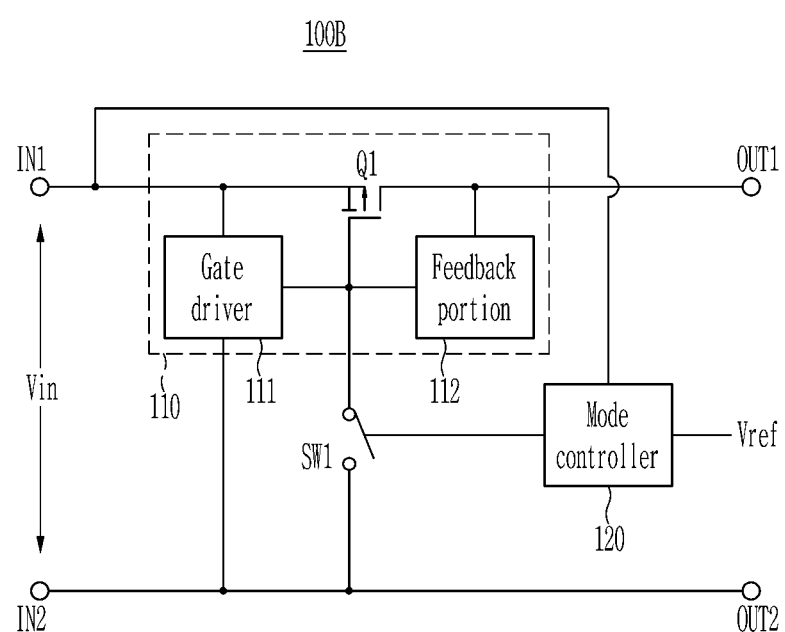
FIG. 3 schematically illustrates an inrush current limiter according to other embodiments of the present disclosure.
Figure 4:
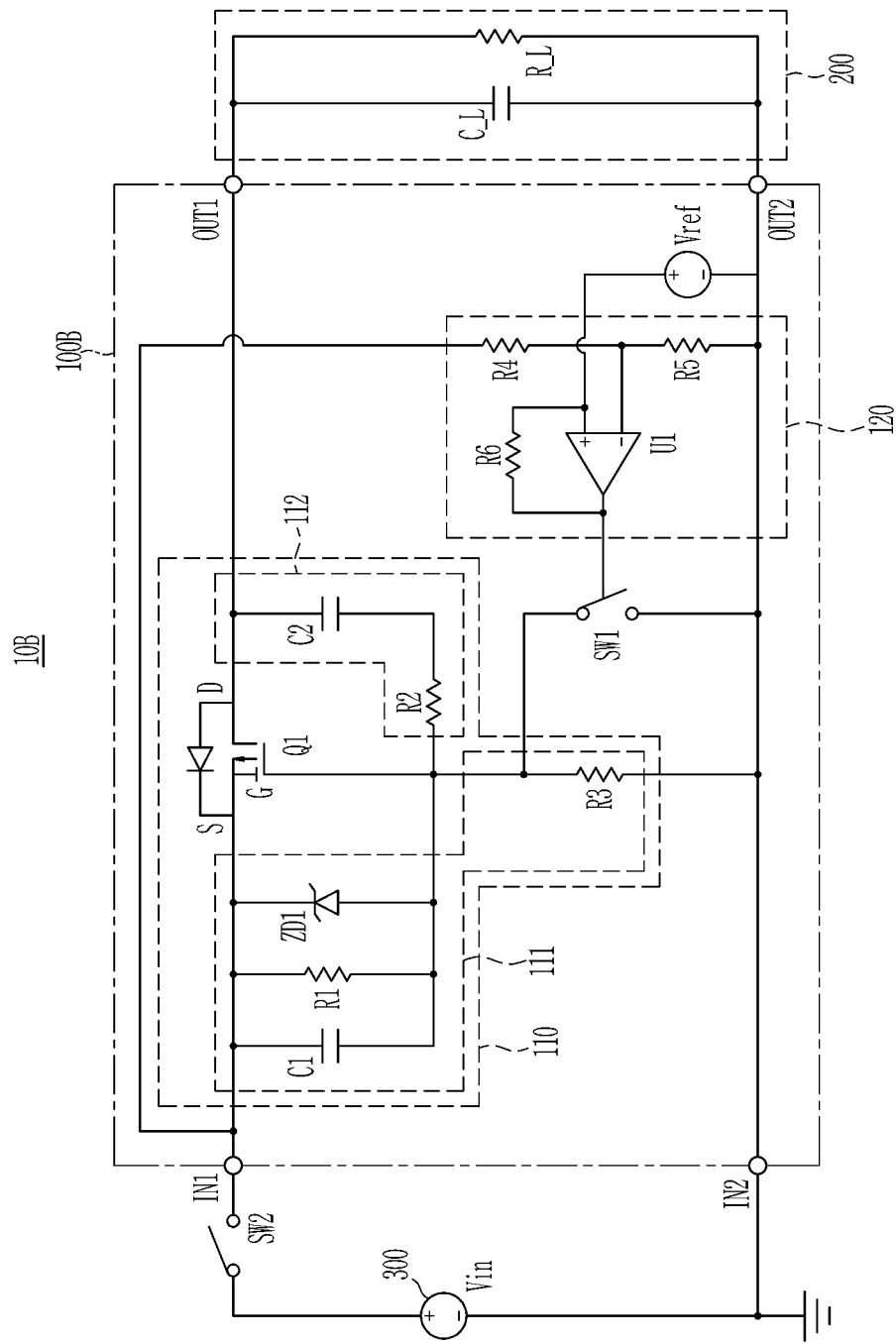
FIG. 4 schematically illustrates a system to which the inrush current limiter of FIG. 3 is applied.

FIG. 3 schematically illustrates an inrush current limiter 100B according to other embodiments of the present disclosure, and FIG. 4 schematically illustrates a system 10B to which the inrush current limiter of FIG. 3 is applied.

Referring to FIG. 3 and FIG. 4, the inrush current limiter 100B and the system 10B according to other embodiments of the present disclosure are different from the inrush current limiter 100A and the system 10A according to the above-described embodiment of the present disclosure in that voltage divider circuits R4 and R5 are not connected to a first output node OUT1, but are instead connected to a first input node IN1. Therefore, hereinafter, to avoid unnecessary redundant description, descriptions of the remaining constituent elements that operate similarly to the inrush current limiters 100A and the system 10A described above will not be repeated.

As in the above-described example, when the voltage divider circuits R4 and R5 are connected to the first output node OUT1, a delay (e.g., a predetermined delay) may occur until a voltage Vin supplied by a power source 300 is normally transmitted to a first output node OUT1 due to operation of the inrush current limiter 110, and accordingly, a delay (e.g., a predetermined delay) may occur until voltage divider circuits R4 and R5 transmit a voltage corresponding to the normal input voltage Vin to the comparator U1.

Contrastingly, as shown in FIG. 3 and FIG. 4, when the first input terminal of the comparator U1 is connected to the first input node IN1 through voltage divider circuits R4 and/or R5 (e.g., through fourth transistor R4), the input voltage Vin is transmitted directly to the voltage divider circuits R4 and R5 when the power source 300 is connected, and accordingly, the comparator U1 also directly receives the voltage corresponding to the normal input voltage Vin.

Meanwhile, as in the above-described example, in the inrush current limiter 100b, the comparator U1 may be activated after a time (e.g., a predetermined time) lapses after connection of the power source 300 so as to reduce or prevent occurrence of power waste due to unnecessary operation of the comparator U1 while the inrush current limiter 100B performs inrush current limitation operation.

Hereinafter, referring to FIG. 5, a method for operating the inrush current limiters 100A and 100B according to the embodiments of the present disclosure will be described in more detail.

Figure 5:
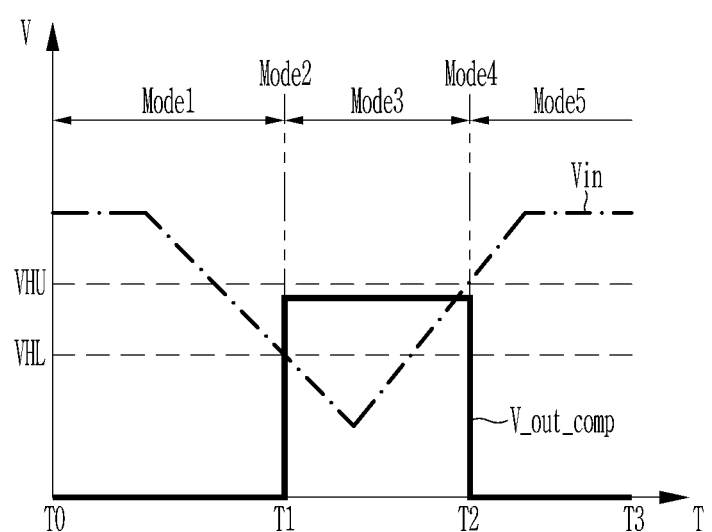
FIG. 5 schematically illustrates an operation timing diagram of the inrush current limiters according to the embodiments of the present disclosure.

FIG. 5 schematically illustrates an operation timing diagram of the inrush current limiters 100A and 100B according to the embodiments of the present disclosure, and illustrates a case in which a low-voltage test voltage is applied for an EMC test after connection of the power source 300 to the systems 10A and 10B.

For example, when the main switch SW2 is turned on, and thus when the input voltage Vin starts to be supplied from the power source 300, an inrush current may occur at the input terminal due to the charging voltage of the load capacitor C_L, which is close to a zero potential (0 V) at the early stage. Thus, the inrush current limiter 100A at the beginning of the connection of the power source 300 operates in the inrush-current-limiting mode to suppress the inrush current transmitted to the load 200.

After that, when the transistor Q1 is turned on, and when a predetermined time lapses and the input current is stabilized, the comparator U1 is activated for monitoring of the input voltage Vin, and the inrush current limiters 100A and 100B continuously monitor a voltage level of the input voltage Vin through the comparator U1 (Mode 1). In this case, the transistor Q1 is completely turned on, and the comparator U1 operates in saturation.

The mode controller 120 turns on the mode control switch SW1 when it detects that the input voltage Vin drops below the rated voltage of the system 10A for EMC tests while monitoring the input voltage Vin through the comparator U1 (Mode 2). That is, when the voltage input corresponding to the input voltage Vin is lower than a first threshold value VHL, an output signal V_out_comp for controlling the mode control switch SW1 to be turned on is transmitted to a control terminal of the mode control switch SW1. Here, the first threshold value VHL corresponds to the lower limit of the hysteresis band of the hysteresis comparator U1.

In a section in which the mode control switch SW1 is turned on (e.g., Mode 3 in FIG. 5), when the voltage level of the input voltage Vin is higher than the threshold voltage level of the transistor Q1, the transistor Q1 may be completely turned on. Therefore, it is possible to operate the transistor Q1 even when a lower voltage than the rated voltage of systems 10A and 10B is input, as in the case of the EMC test.

Meanwhile, the mode controller 120 continuously monitors the voltage level of the input voltage Vin through the comparator U1 even in the Mode 2 section, and turns off the mode control switch SW1 when it is detected that the input voltage Vin increases within the rated voltage range of the system 10A due to the termination of the EMC situation during the monitoring (e.g., Mode 4 in FIG. 5). That is, the comparator U1 controls an output signal V_out_comp to control the mode control switch SW1 to be turned off, or in the turn off state, when the voltage input corresponding to the input voltage Vin is higher than the second threshold value VHU. Here, the second threshold value VHU corresponds to the upper limit of the hysteresis band of the hysteresis comparator U1.

As the mode control switch SW1 is turned off, the inrush current limiters 100A and 100B return to the inrush-current-limiting mode, and the turn on of the transistor Q1 is controlled by the gate driver 111 (e.g., Mode 5 in FIG. 5).

According to the above-described embodiments, in the inrush current limiters 100A and 100B of the systems 10A and 10B, the transistor Q1 is turned on even when the input voltage Vin of lower than the rated voltage of the systems 10A and 10B is input (e.g., as in an EMC test process) such that it is possible to reduce or prevent the likelihood of a situation where power is not supplied to the load 200 due to malfunction of the transistor Q1.

An electronic or electrical device and/or any other related device or constituent element according to the embodiments of the present disclosure described herein can be implemented using any suitable hardware, firmware (e.g., application-specific integrated circuits), software, or a combination of software, firmware, and hardware. For example, the elements of various configurations of the devices can be formed on a single integrated circuit (IC) chip or on separate IC chips. In addition, the elements of various configurations of the devices can be implemented as a flexible printed circuit film, a tape carrier package (TCP), or a printed circuit board (PCB), or may be implemented on a single substrate. The electrical connection or interconnection described in the present specification can be implemented by wire or conductive elements on, for example, a PCB or other type of circuit carrier. The conductive element may include metallization such as surface metallization and/or pins, and may include conductive polymers or ceramics. In addition, electrical energy may be transmitted through a wireless connection using, for example, electron radiation or light.

In addition, the various configurations elements of the devices may be a process or a thread that runs on at least one processor and at least one computing device to perform the various functions described herein, executes computer program instructions, and interacts with other system constituent elements. The computer program instructions are stored in a memory that can be implemented in a computing device using standard memory devices, such as a random access memory (RAM). The computer program instructions may also be stored on other non-transitory computer readable media such as, for example, a CD-ROM, a flash drive, and the like.

In addition, a person of ordinary skill in the art should recognize that functions of various computing devices may be combined or integrated into a single computing device, or functions of a specific computing device can be distributed across different computing devices, while not departing from the range of embodiments of the present disclosure.

| Description of symbols | |
|---|---|
| 10: system | 100: inrush current limiter |
| 110: inrush current limiter | 111: gate driver |
| 112: feedback portion | 120: mode controller |
| 200: load | 300: power source |
| IN1, IN2: input node | OUT1, OUT2: output node |
| SW1: mode control switch | SW2: main switch   U1: comparator |

What is claimed is:

1. An inrush current limiter comprising:
a first input node and a second input node for receiving an input voltage from a power source;
a first output node and a second output node for being connected with a load;
an inrush-current-limiting portion comprising a transistor connected between the first input node and the first output node, and for turning on the transistor when a voltage level of the input voltage is higher than a first level, and for limiting an inrush current by controlling time until the transistor is turned on after application of the input voltage;
a switch connected between a control terminal of the transistor and the second input node; and
a mode controller configured to:
turn on the switch when the voltage level of the input voltage is lower than a second level that is lower than the first level; and
turn off the switch when a voltage level of the input voltage is higher than a first level,
wherein, when the switch is off, the inrush-current-limiting portion is configured to control the transistor to turn on gradually to limit an inrush current, and
wherein, when the switch is on and a voltage level of the input voltage is equal to or higher than the second level, the input voltage is applied between the second input node and the control terminal of the transistor to turn on the transistor.

2. A system comprising the inrush current limiter of claim 1.

3. The inrush current limiter of claim 1, wherein the transistor comprises a first terminal connected to the first input node, and a second terminal connected to the first output node, and
wherein turn-on of the transistor is controlled by a voltage between the first terminal and the control terminal.

4. A system comprising the inrush current limiter of claim 3.

5. The inrush current limiter of claim 3, wherein the transistor comprises a metal-oxide semiconductor field-effect transistor (MOSFET),
wherein the first terminal and the second terminal respectively comprise a source and a drain of the transistor, and
wherein the control terminal comprises a gate of the transistor.

6. A system comprising the inrush current limiter of claim 5.

7. The inrush current limiter of claim 5, wherein the second input node is connected to a ground.

8. The inrush current limiter of claim 3, wherein the inrush current limiter comprises a gate driver for gradually increasing a voltage between the first terminal and the control terminal when the input voltage is input.

9. A system comprising the inrush current limiter of claim 8.

10. The inrush current limiter of claim 8, wherein the gate driver comprises
a first resistor and a first capacitor connected in parallel between the first terminal and the control terminal; and
a second resistor that is connected between the control terminal and the second input node.

11. The inrush current limiter of claim 10, wherein the gate driver further comprises a Zener diode that is connected between the first terminal and the control terminal for limiting a voltage between the first terminal and the control terminal.

12. The inrush current limiter of claim 8, wherein the inrush current limiter further comprises a feedback portion connected between the second terminal and the control terminal for stabilizing a voltage between the first terminal and the control terminal.

13. The inrush current limiter of claim 12, wherein the feedback portion comprises a capacitor and a resistor connected in series between the first terminal and the control terminal.

14. The inrush current limiter of claim 1, wherein the mode controller comprises a comparator comprising:
a first input terminal for receiving a comparison voltage corresponding to the input voltage,
a second input terminal for receiving a reference voltage, and
an output terminal for outputting an output signal corresponding to a comparison result of voltages input through the first and second input nodes to a control terminal of the switch.

15. A system comprising the inrush current limiter of claim 14.

16. The inrush current limiter of claim 14, wherein the mode controller comprises a first resistor and a second resistor that are connected in series as part of a voltage divider circuit for outputting the comparison voltage divided from the input voltage to the first input terminal.

17. A system comprising the inrush current limiter of claim 16.

18. The inrush current limiter of claim 16, wherein the mode controller further comprises a third resistor between the second input terminal and the output terminal of the comparator, and wherein the comparator is configured to operate as a hysteresis comparator based on a hysteresis band having a lower limit that is lower than the reference voltage, and an upper limit that is higher than the reference voltage, is configured to output an output signal that turns on the switch to the output terminal when the comparison voltage is lower than the lower limit, and is configured to output an output signal that turns off the switch when the comparison voltage is higher than the upper limit.

19. The inrush current limiter of claim 16, wherein the first resistor and the second resistor are connected between the first output node and ground, and wherein the comparator is configured to be activated after application of the input voltage.

20. The inrush current limiter of claim 16, wherein the first resistor and the second resistor are connected between the first input node and ground.

* * * * *